United States Patent
Morita et al.

(10) Patent No.: US 7,521,803 B2
(45) Date of Patent: Apr. 21, 2009

(54) SEMICONDUCTOR DEVICE HAVING FIRST AND SECOND DUMMY WIRINGS VARYING IN SIZES/COVERAGE RATIOS AROUND A PLUG CONNECTING PART

(75) Inventors: Toshiyuki Morita, Kawasaki (JP); Takeshi Nishioka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 162 days.

(21) Appl. No.: 11/583,698

(22) Filed: Oct. 20, 2006

(65) Prior Publication Data
US 2007/0099394 A1 May 3, 2007

(30) Foreign Application Priority Data
Oct. 21, 2005 (JP) ............................ P2005-307304

(51) Int. Cl.
 H01L 23/48 (2006.01)
 H01L 23/52 (2006.01)
 H01L 29/40 (2006.01)
(52) U.S. Cl. ...................................... 257/758; 438/926
(58) Field of Classification Search ................. 257/758; 438/926
See application file for complete search history.

(56) References Cited

U.S. PATENT DOCUMENTS 5,798,289 A * 8/1998 Ajika et al. .................. 438/239
6,424,042 B1 * 7/2002 Kitani .......................... 257/752
6,693,315 B2 * 2/2004 Kuroda et al. ............... 257/288
6,693,357 B1 * 2/2004 Borst et al. ................... 257/773

(Continued)

FOREIGN PATENT DOCUMENTS

JP 8-264647 10/1996

(Continued)

OTHER PUBLICATIONS

H.P. Feng, M.Y. Cheng, Y.L. Wang, S.C. Chang, Y.Y. Wang, C.C. Wan, Mechanism for Cu void defect on various electroplated film conditions, Thin Solid Films, vol. 498, Issues 1-2, Proceedings of The Third Asian Conference on Chemical Vapor Deposition (Third Asian-CVD),—Third Asian CVD, Mar. 1, 2006, pp. 56-59.*

(Continued)

*Primary Examiner*—Anh D Mai
*Assistant Examiner*—Diana C Garrity
(74) *Attorney, Agent, or Firm*—Finnegan, Henderson, Farabow, Garrett & Dunner, L.L.P.

(57) ABSTRACT

A semiconductor device, has a semiconductor substrate; a first insulating film which is disposed above the semiconductor substrate; a second insulating film which is disposed above the first insulating film; a wiring which is disposed in the first insulating film and has a plug connecting part; a plug which is disposed in the second insulating film and connected to the plug connecting part; a plurality of first dummy wirings which are disposed in a first area near the plug connecting part in the first insulating film; and a plurality of second dummy wirings which are disposed in a second area near the wiring excepting the plug connecting part in the first insulating film, and have at least either a width smaller than that of the first dummy wirings or a pattern coverage ratio larger than that of the first dummy wirings.

7 Claims, 14 Drawing Sheets

U.S. PATENT DOCUMENTS

| | | | |
|---|---|---|---|
| 7,301,236 B2 * | 11/2007 | Greco et al. | 257/758 |
| 2004/0211958 A1 | 10/2004 | Osamura et al. | |
| 2006/0097399 A1 | 5/2006 | Hatano et al. | |

FOREIGN PATENT DOCUMENTS

| | | |
|---|---|---|
| JP | 2004-327666 | 11/2004 |
| JP | 2005-167120 | 6/2005 |
| JP | 2006-156998 | 6/2006 |

OTHER PUBLICATIONS

Notification of the First Office Action issued by the Chinese Patent Office on Feb. 1, 2008, for Chinese Patent Application No. 200610162720.3, and English-language translation thereof.

* cited by examiner

SEMICONDUCTOR DEVICE HAVING FIRST AND SECOND DUMMY WIRINGS VARYING IN SIZES/COVERAGE RATIOS AROUND A PLUG CONNECTING PART

CROSS-REFERENCE TO THE INVENTION

This application is based upon and claims the benefit of priority from the prior Japanese Patent Application No. 2005-307304, filed on Oct. 21, 2005; the entire contents of which are incorporated herein by reference.

BACKGROUND OF THE INVENTION

1. Field of the Invention

The present invention relates to a semiconductor device and manufacturing method thereof.

2. Description of the Related Art

Recently, Cu has been used instead of Al as wirings of semiconductor devices in order to decrease the resistance of wirings and to improve the resistance of migration such as electro migration (EM) and stress migration (SM) which becomes a cause of defective wiring.

It is hard to fabricate Cu by RIE (Reactive Ion Etching) which is used for Al. Therefore, the following damascene method is used to form wirings of Cu. Specifically, grooves and holes are formed on the surface of an insulating film, a Cu film is formed on the insulating film such that Cu is buried in the grooves and holes, and then unnecessary portions of the Cu film are removed by chemical mechanical polishing. As a result, the wirings are formed.

As a Cu film forming method according to the damascene method, an electrolytic plating method is extensively used. To a plating solution used for the electrolytic plating are mixed prescribed amounts of, for example, additives such as an accelerator, a suppressor and a leveler in addition to Cu ions in order to improve an embedding property and to realize evenness of the Cu film surface. The additives are included as impurities into the Cu film.

But, if the impurity concentration in the Cu film is high, the impurities may deposit as a result of a heat treatment to produce voids in the wirings. Here, if the voids are formed in via-plugs of an upper layer or portions immediately below contact plugs, conduction failure is caused at the via-plugs or contact plugs, possibly resulting in a failure in initial electric property.

Meanwhile, if the impurity concentration in the Cu film is low, microvoids are spread quickly because the Cu film has an uniform crystal structure, and reliability of the stress migration (SM) lowers considerably.

There is disclosed a technology that dummy patterns of an insulating material are formed in the wirings of a lower layer to surround via holes of an upper layer, thereby preventing voids from being produced in the portions immediately below the via holes (see JP-A 2004-327666 (KOKAI)).

SUMMARY OF THE INVENTION

A semiconductor device according to an aspect of the present invention comprises a semiconductor substrate; a first insulating film which is disposed above the semiconductor substrate; a second insulating film which is disposed above the first insulating film; a wiring which is disposed in the first insulating film and has a plug connecting part; a plug which is disposed in the second insulating film and connected to the plug connecting part; a plurality of first dummy wirings which are disposed in a first area near the plug connecting part in the first insulating film; and a plurality of second dummy wirings which are disposed in a second area near the wiring excepting the plug connecting part in the first insulating film, and have at least either a width smaller than that of the first dummy wirings or a pattern coverage ratio larger than that of the first dummy wirings.

A semiconductor device according to another aspect of the present invention comprises a semiconductor substrate; a first insulating film which is disposed above the semiconductor substrate; a second insulating film which is disposed above the first insulating film; a wiring which is disposed in the first insulating film and has a plug connecting part; a plug which is disposed in the second insulating film and connected to the plug connecting part; a plurality of dummy wirings which are disposed outside a first area but in a second area excepting the first area near the wiring in the first insulating film, the first area being defined by a distance resulting from the addition of at least 0.5 μm to a half of a width of the wiring from a center of a region where the plug connecting part and the plug are connected, and have a width of 0.5 μm or less and a pattern coverage ratio of 25% or more.

DESCRIPTION OF THE EMBODIMENTS

First Embodiment

Figure 1:
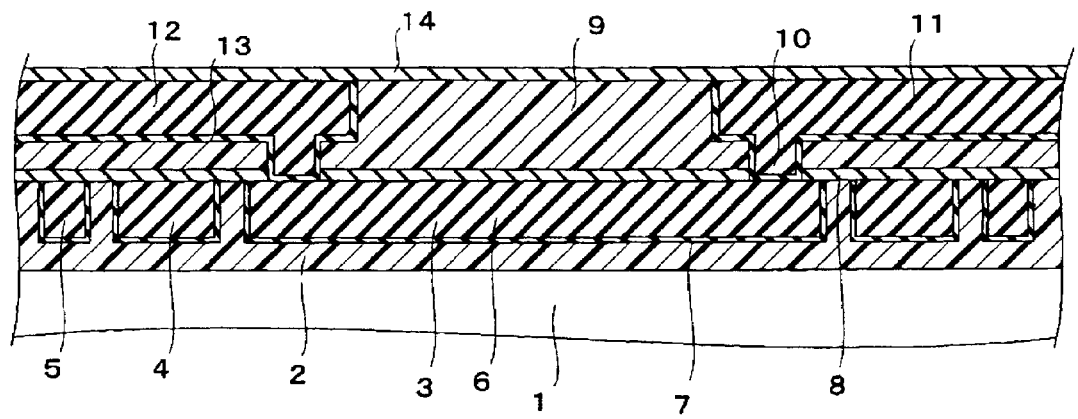
FIG. 1 is a schematic vertical sectional view of a semiconductor device according to a first embodiment.
Figure 2:
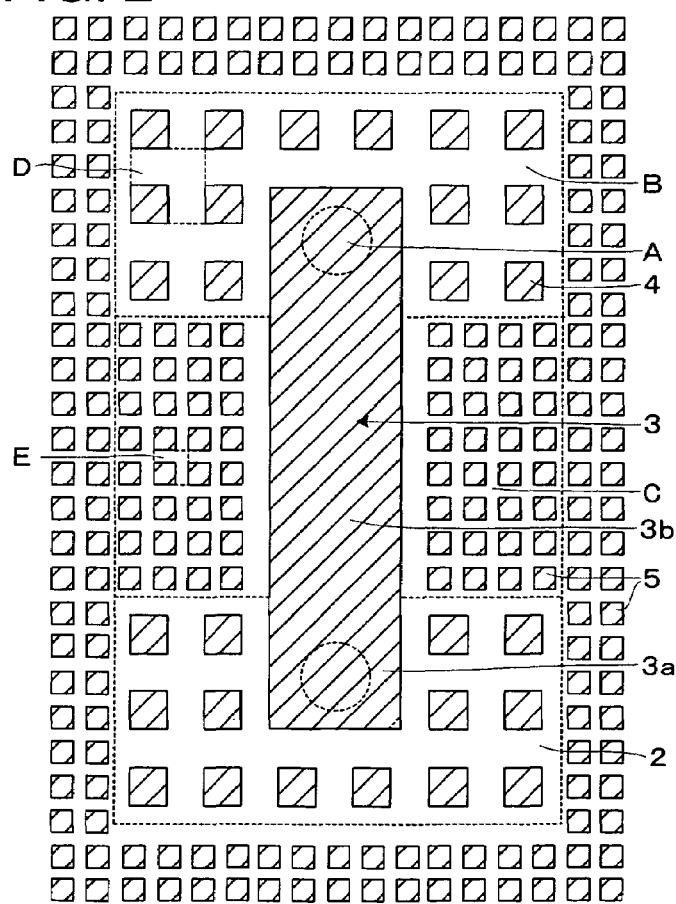
FIG. 2 is a schematic horizontal sectional view of the semiconductor device according to the first embodiment.
Figure 3A:
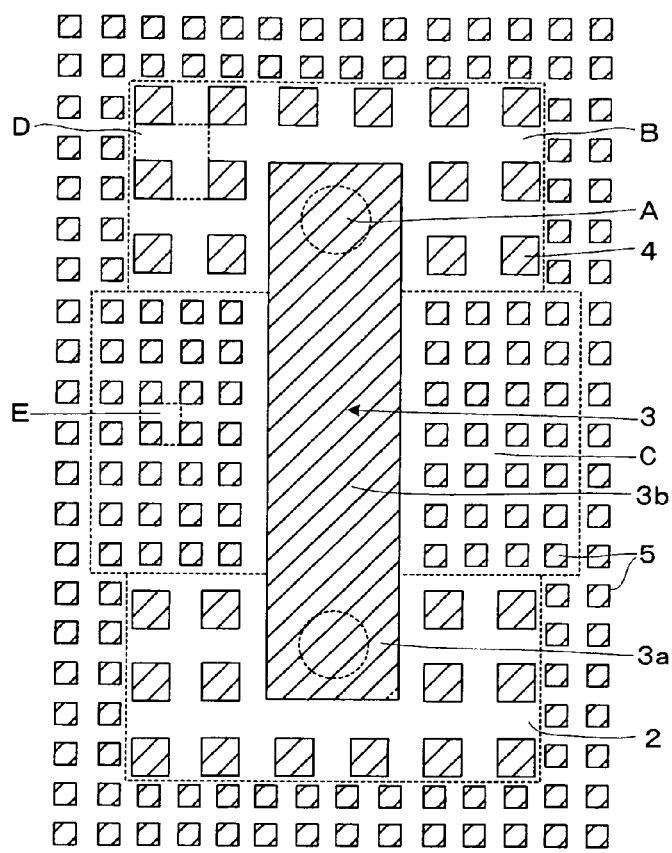
FIG. 3A and FIG. 3B are schematic horizontal sectional views of other semiconductor devices according to the first embodiment.
Figure 3B:
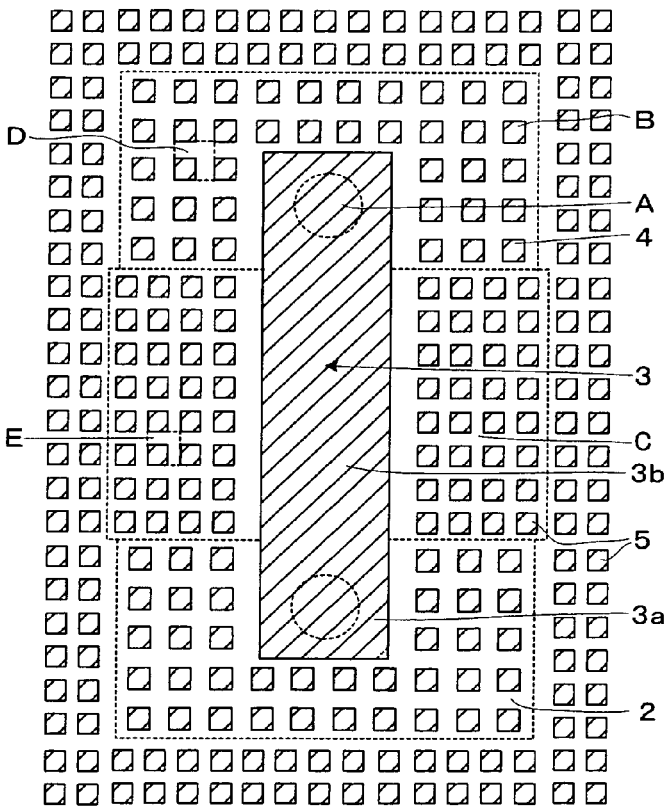

A first embodiment will be described with reference to the drawings. FIG. 1 is a schematic vertical sectional view of a semiconductor device according to this embodiment, FIG. 2 is a schematic horizontal sectional view of the semiconductor device according to this embodiment, and FIG. 3A and FIG. 3B are schematic horizontal sectional views of other semiconductor devices according to this embodiment.

As shown in FIG. 1, the semiconductor device is provided with a semiconductor substrate 1 which has, for example, an active element such as a transistor (not shown) and an oxide film (not shown), and an interlayer insulating film 2 is formed as a first insulating film on the semiconductor substrate 1.

Examples of the interlayer insulating film 2 include an insulating film (low-k film) having a low dielectric constant and an $SiO_2$ film. Examples of the insulating film having a low dielectric constant include an organic Si oxide film, an organic resin film and a porous Si oxide film.

In the interlayer insulating film 2, a first layer wiring 3, plural first dummy wirings 4 and plural second dummy wirings 5 are formed to have substantially the same plane to one another. The first layer wiring 3 functions as an actual wiring, but the first dummy wirings 4 and the second dummy wirings 5 do not function as an actual wiring.

The first layer wiring 3 and the like are comprised of a wiring layer 6 and a barrier metal film 7 which covers the side and bottom surfaces of the wiring layer 6. A component material of the wiring layer 6 is, for example, a metal material such as Cu, Ag or Au, and a component material of the barrier metal film 7 is, for example, a conductive material such as Ta, Ti, TaN, TiN, NbN, WN or VN. The barrier metal film 7 may be formed of a laminate of the above materials.

The first layer wiring 3 is comprised of via-plug connecting parts 3a including a region A (hereinafter referred to as "via-plug connecting region") connected to via-plugs 10 described later, and a via-plug non-connecting part 3b which is a portion of the first layer wiring 3 excepting the via-plug connecting parts 3a.

The via-plug connecting parts 3a have an impurity concentration lower than that of the via-plug non-connecting part 3b. Here, the "impurity" means a substance having at least any of C, O, S, Cl and N. The first layer wiring 3 desirably has a width of 0.3 μm or more.

The first dummy wirings 4 are formed near the via-plug connecting parts 3a as shown in FIG. 2. Specifically, the first dummy wirings 4 are formed on a first region B having an edge that borders the first wiring layer 3 including the via-plug connecting parts 3a. The edge of first region B that borders first wiring layer 3 is offset by a distance of at least 0.5 μm from the center of via-plug connecting region A, for example, at least 0.5 μm beyond a half of a width of the wiring. The first dummy wirings 4 have a width of about 2 to 3 μm and a pattern coverage ratio of about 25 to 50%.

The second dummy wirings 5 are formed near the via-plug non-connecting part 3b. Specifically, the second dummy wirings 5 are formed in a second region C which is located outside the first region B and near the via-plug non-connecting part 3b including a range of less than 0.5 μm from it. The second dummy wirings 5 are also formed in a region outside of the first region B and outside of the second region C.

The second dummy wirings 5 have at least either a width smaller than that of the first dummy wirings 4 and a pattern coverage ratio larger than that of the first dummy wirings 4. Here, the pattern coverage ratio of the dummy wirings of this embodiment means a pattern coverage ratio of the dummy wirings per unit of a single dummy wiring. Specifically, the pattern coverage ratio of the first dummy wirings 4 means a ratio of an occupied area of a single first dummy wiring 4 to an area of a region D, and the pattern coverage ratio of the second dummy wirings 5 means a ratio of an occupied area of a single second dummy wiring 5 to an area of a region E.

The second dummy wirings 5 have preferably a width of 0.5 μm or less, and more preferably 0.01 μm or more and 0.3 μm or less. And, the second dummy wirings 5 have preferably a pattern coverage ratio of 25% or more. Besides, the second dummy wirings 5 have more preferably a pattern coverage ratio of 25% or more and 70% or less in order to obtain the surface flatness of the interlayer insulating film 2 after forming the second dummy wirings 5.

FIG. 2 shows that the second dummy wirings 5 have a width smaller than that of the first dummy wirings 4, and the second dummy wirings 5 have a pattern coverage ratio larger than that of the first dummy wirings 4. But, in a case where the second dummy wirings 5 have a width smaller than that of the first dummy wirings 4, the pattern coverage ratio of the second dummy wirings 5 may be not larger than that of the first dummy wirings 4 as shown in FIG. 3A. In a case where the second dummy wirings 5 have a pattern coverage ratio larger than that of the first dummy wirings 4, the second dummy wirings 5 may have a width not smaller than that of the first dummy wirings 4 as shown in FIG. 3B.

In FIG. 3A, for example, the first dummy wirings 4 have a size of about 1 μm square and a pattern coverage ratio of about 25%, while the second dummy wirings 5 have a size of about 0.3 μm square and a pattern coverage ratio of about 25%.

And, in FIG. 3B, for example, the first dummy wirings 4 have a size of about 0.3 μm square and a pattern coverage ratio of about 20%, and the second dummy wirings 5 have a size of about 0.3 μm square and a pattern coverage ratio of about 50%.

A cap insulating film 8 is formed on the interlayer insulating film 2. A component material of the cap insulating film 8 is, for example, SiC, $SiO_2$ or $Si_3N_4$.

An interlayer insulating film 9 is formed as a second insulating film on the cap insulating film 8. The component material of the interlayer insulating film 9 is the same as that of the interlayer insulating film 2.

The via-plugs 10 and a second layer wiring 11 are formed in the interlayer insulating film 9. The via-plugs 10 are positioned just above the first layer wiring 3 of the via-plug connecting region A and connected to the via-plug connecting parts 3a of the first layer wiring 3. The second layer wiring 11 is electrically connected to the first layer wiring 3 through the via-plugs 10.

The via-plugs 10 are formed of a wiring layer 12 and a barrier metal film 13 which covers the side and bottom surfaces of the wiring layer 12. The component material of the wiring layer 12 is the same as that of the wiring layer 6, and the component material of the barrier metal film 13 is the same as that of the barrier metal film 7.

A cap insulating film 14 is formed on the interlayer insulating film 9. The component material of the cap insulating film 14 is the same as that of the cap insulating film 8. It should be noted that a passivation film, electrode pads and the like are omitted from the semiconductor device shown in FIG. 1.

This semiconductor device can be manufactured by the following method. FIG. 4A through FIG. 8C are vertical sectional views schematically showing a manufacturing process of the semiconductor device of this embodiment, and FIG. 9 is a plan view schematically showing a manufacturing process of the semiconductor device of this embodiment.

Figure 4A:
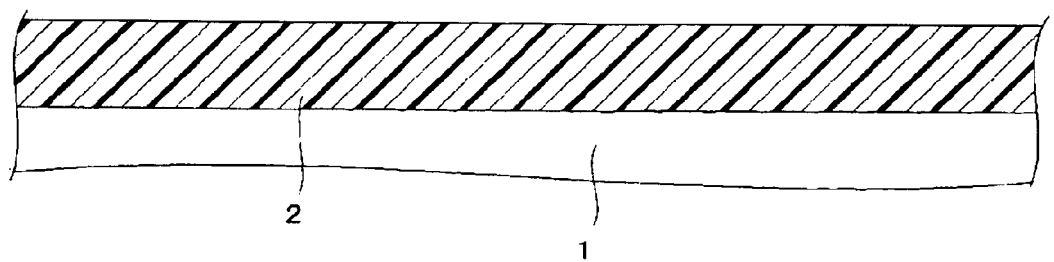
FIG. 4A through FIG. 4C are vertical sectional views schematically showing a manufacturing process of the semiconductor device according to the first embodiment.

First, as shown in FIG. 4A, the interlayer insulating film 2 is formed on, for example, the semiconductor substrate 1 by, for example, a CVD method (Chemical Vapor Deposition) or a coating method.

Figure 4B:
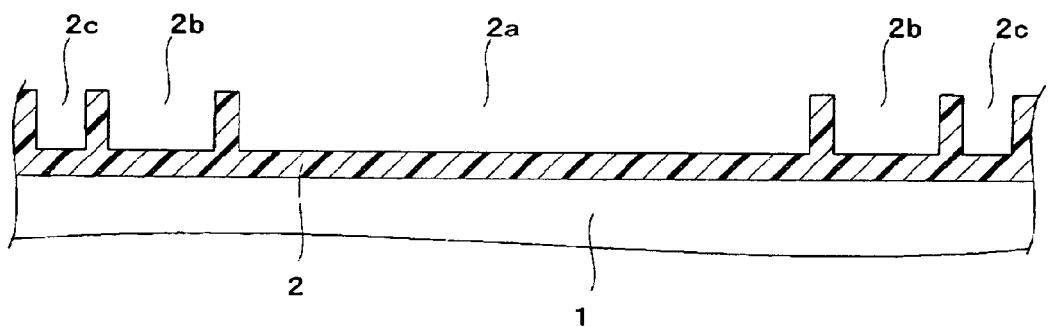

After the interlayer insulating film 2 is formed, a wiring groove 2a, plural first dummy wiring grooves 2b and plural second dummy wiring grooves 2c are formed on the interlayer insulating film 2 by photolithography and reactive ion etching (RIE) as shown in FIG. 4B.

Figure 9:
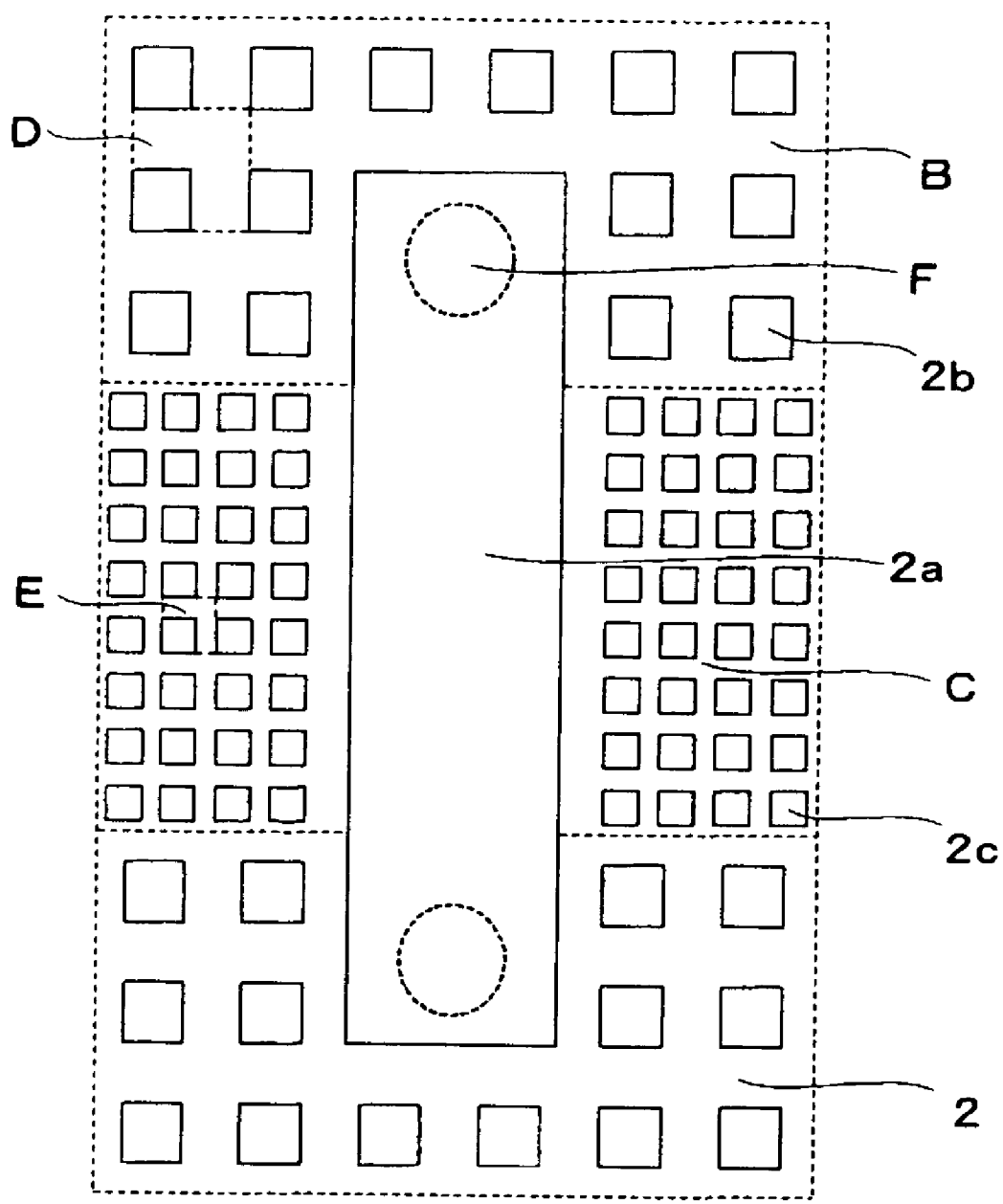
FIG. 9 is a plan view schematically showing a manufacturing process of the semiconductor device according to the first embodiment.

As shown in FIG. 9, the wiring groove 2a is formed in a area including a region F (hereinafter referred to as "scheduled via-plug connection region") for connection with the via-plugs 10. The wiring groove 2a has desirably a width of 0.3 µm or more. The reason why 0.3 µm or more is desirable is that a film forming speed is determined depending on the wiring groove 2a itself if the width is less than 0.3 µm. At this time, there is a possibility that a film forming speed of a plated film 16, which is to be the via-plug non-connecting part 3b and described later, does not decrease even if the second dummy wiring grooves 2c are formed.

The first dummy wiring grooves 2b are formed in the first region B which has a range that 0.5 µm or more is added to a half length of the width of the wiring groove 2a from the center of the scheduled via-plug connecting region F. The first region B is preferably in a range that 200 µm is added to a half length of the width of the wiring groove 2a from the center of the scheduled via-plug connecting region F at a maximum. It is because an influence upon a film forming speed of the plated film 16 which becomes the via-plug connecting part 3a to be described later is small if the range exceeds 200 µm even if the dummy wiring grooves are arranged densely. The first dummy wiring grooves 2b have a width of about 2 to 3 µm and a pattern aperture ratio of about 25 to 50%.

The second dummy wiring grooves 2c are formed in the second region C. The second dummy wiring grooves 2c have at least either a width smaller than that of the first dummy wiring grooves 2b or a pattern aperture ratio larger than that of the first dummy wiring grooves 2b.

Here, the pattern aperture ratio of the dummy wiring grooves of this embodiment means a pattern aperture ratio of the dummy wiring grooves per unit of a single dummy wiring groove. Specifically, the pattern aperture ratio of the first dummy wiring grooves 2b means a ratio of an occupied area of a single first dummy wiring groove 2b to an area of the region D. The pattern aperture ratio of the second dummy wiring grooves 2c means a ratio of an occupied area of a single second dummy wiring grooves 2c to an area of the region E. The first dummy wirings 4 are formed by embedding the plated film 16 to be described later into the first dummy wiring grooves 2b, so that the pattern aperture ratio and the pattern coverage ratio are almost synonymous.

The second dummy wiring grooves 2c have preferably a width of 0.5 µm or less, and more preferably 0.01 µm or more and 0.3 µm or less. And, the second dummy wiring grooves 2c have preferably a pattern aperture ratio of 25% or more, and more preferably 25% or more and 70% or less.

To form the wiring groove 2a, a resist pattern having a pattern of the first layer wiring 3 transferred is first formed on the interlayer insulating film 2. This resist pattern is used as a mask, and the interlayer insulating film 2 is etched by RIE to form the wiring groove 2a on the interlayer insulating film 2.

After the wiring groove 2a is formed on the interlayer insulating film 2, the resist pattern is removed by ashing or the like.

Figure 4C:
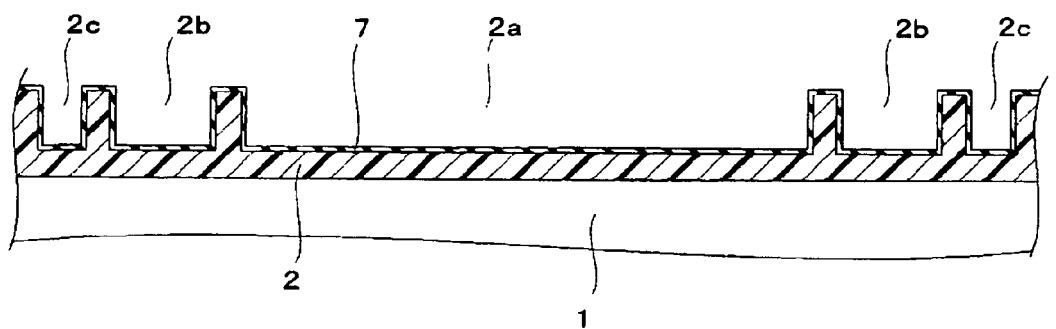
Figure 5A:
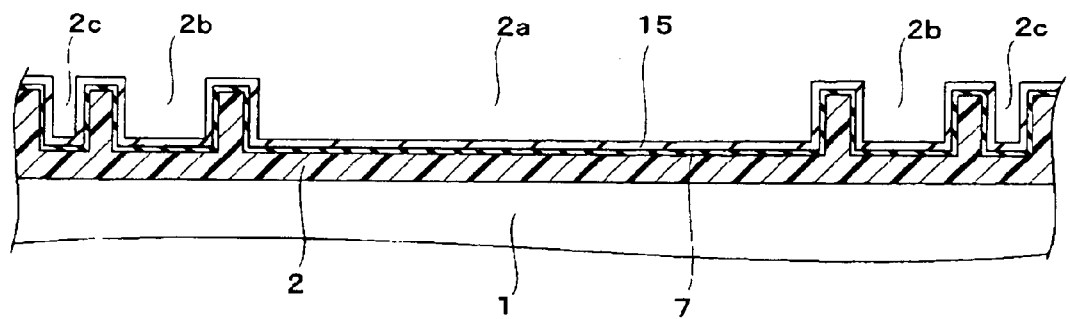
FIG. 5A through FIG. 5C are vertical sectional views schematically showing a manufacturing process of the semiconductor device according to the first embodiment.

After the wiring groove 2a is formed, the barrier metal film 7 is formed on the interlayer insulating film 2 by, for example, a sputtering method or a CVD method as shown in FIG. 4C. After the barrier metal film 7 is formed, a seed film 15 for passing an electric current at the time of electrolytic plating is formed on the barrier metal film 7 by, for example, a sputtering method as shown in FIG. 5A. As a component material of the seed film 15, for example, a metal material such as Cu, Ag or Au can be used.

Figure 5B:
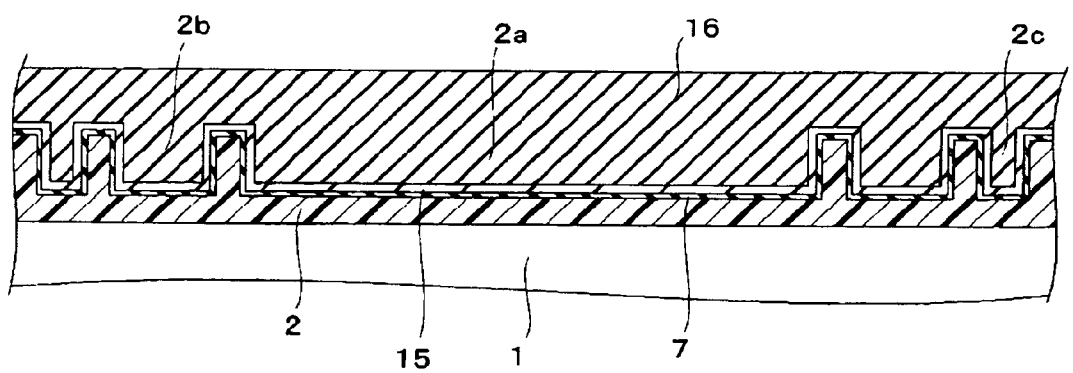

After the seed film 15 is formed, the plated film 16 is formed on the seed film 15 by the electrolytic plating method as shown in FIG. 5B. As a component material of the plated film 16, for example, a metal material such as Cu, Ag or Au can be used. To a plating solution used for the electrolytic plating are mixed prescribed amounts of, for example, additives such as an accelerator, a suppressor and a leveler in addition to metal ions such as Cu ions.

Figure 5C:
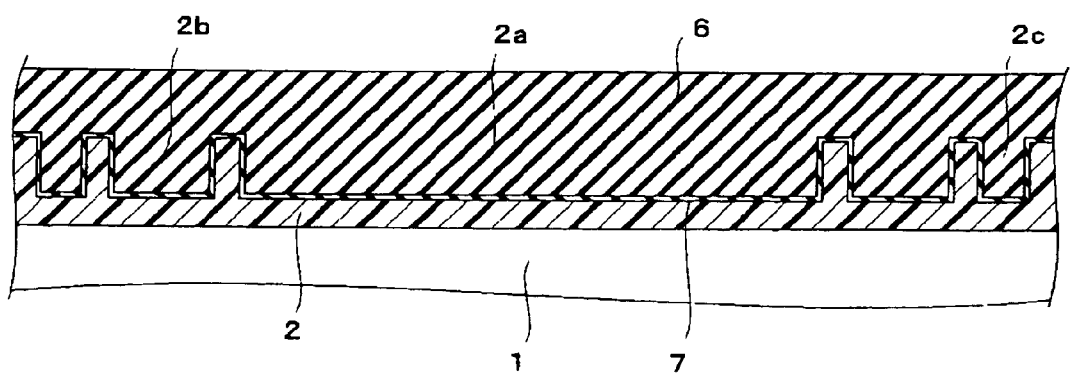

After the plated film 16 is formed, the semiconductor substrate 1 on which the plated film 16 is formed is subjected to a heat treatment (annealing) to grow crystal of the seed film 15 and the plated film 16, thereby forming the wiring film 6 as shown in FIG. 5C.

Figure 6A:
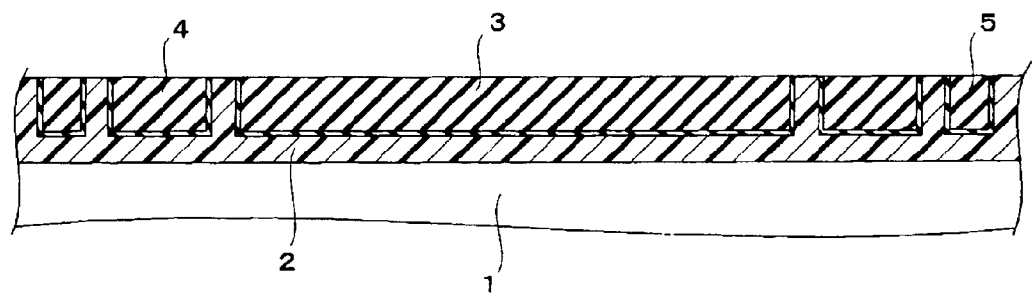
FIG. 6A through FIG. 6C are vertical sectional views schematically showing a manufacturing process of the semiconductor device according to the first embodiment.

After the wiring film 6 is formed, unnecessary portions of the wiring film 6 and the barrier metal film 7 on the interlayer insulating film 2 are removed by polishing by, for example, chemical mechanical polishing (CMP) as shown in FIG. 6A, so that the wiring film 6 and the barrier metal film 7 which are in the wiring groove 2a, the first dummy wiring grooves 2b and the second dummy wiring grooves 2c are remained.

Thus, the first layer wiring 3 is formed within the wiring groove 2a, the first dummy wirings 4 are formed within the first dummy wiring grooves 2b, and the second dummy wirings 5 are formed within the second dummy wiring grooves 2c.

Figure 6B:
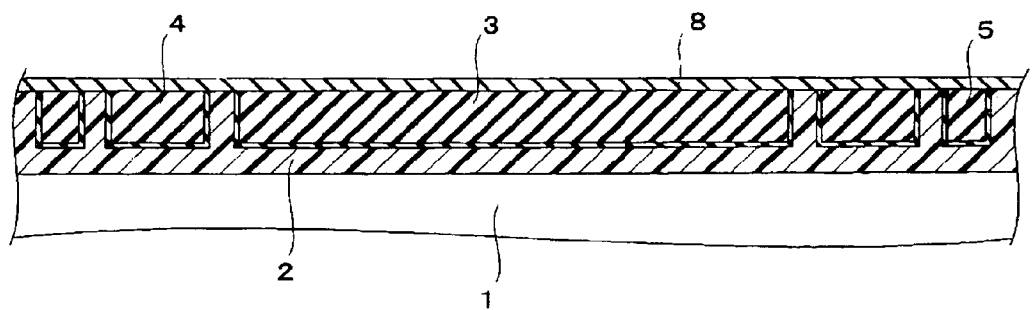

After the first layer wirings 3 are formed, the cap insulating film 8 is formed on the interlayer insulating film 2 by, for example, a CVD method as shown in FIG. 6B.

Figure 6C:
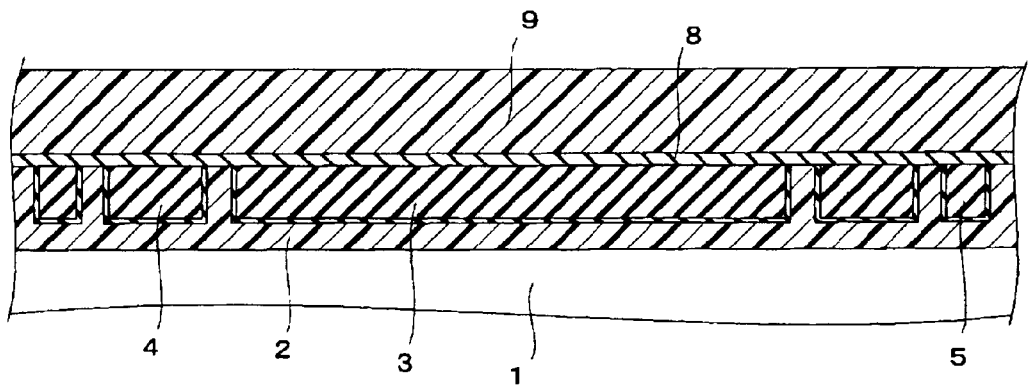

After the cap insulating film 8 is formed, the interlayer insulating film 9 is formed on the cap insulating film 8 by, for example, a CVD method (Chemical Vapor Deposition) or a coating method as shown in FIG. 6C.

Figure 7A:
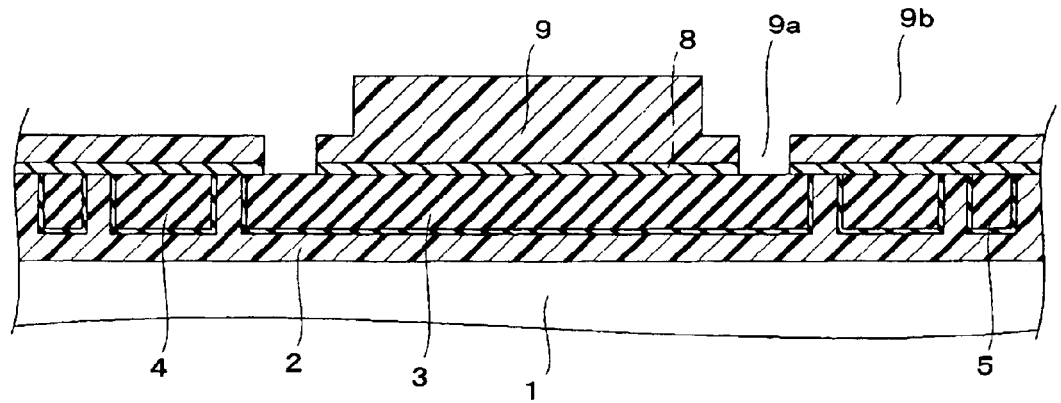
FIG. 7A through FIG. 7C are vertical sectional views schematically showing a manufacturing process of the semiconductor device according to the first embodiment.

After the interlayer insulating film 9 is formed, via holes 9a and wiring grooves 9b or the like are formed on the interlayer insulating film 9 by photolithography and reactive ion etching (RIE) as shown in FIG. 7A.

The via holes 9a are formed just above the scheduled via-plug connection region F, and the wiring grooves 9b are communicated with the via holes 9a. The via holes 9a are formed through the cap insulating film 8.

Figure 7B:
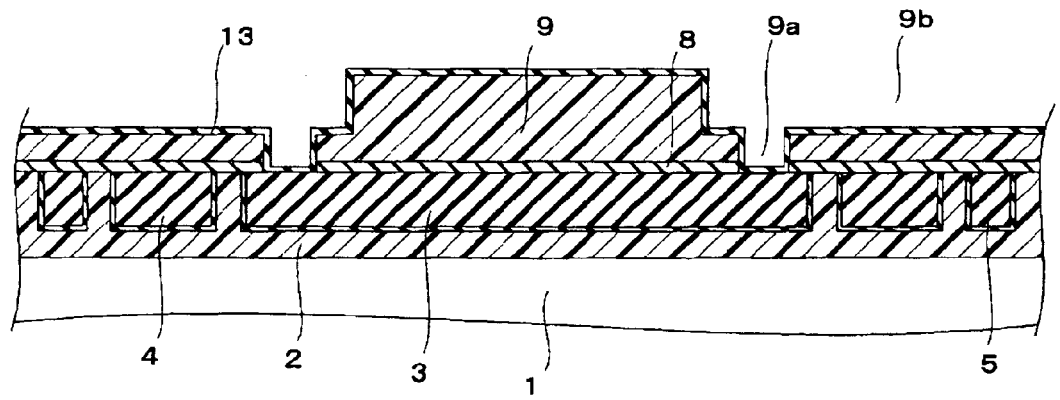
Figure 7C:
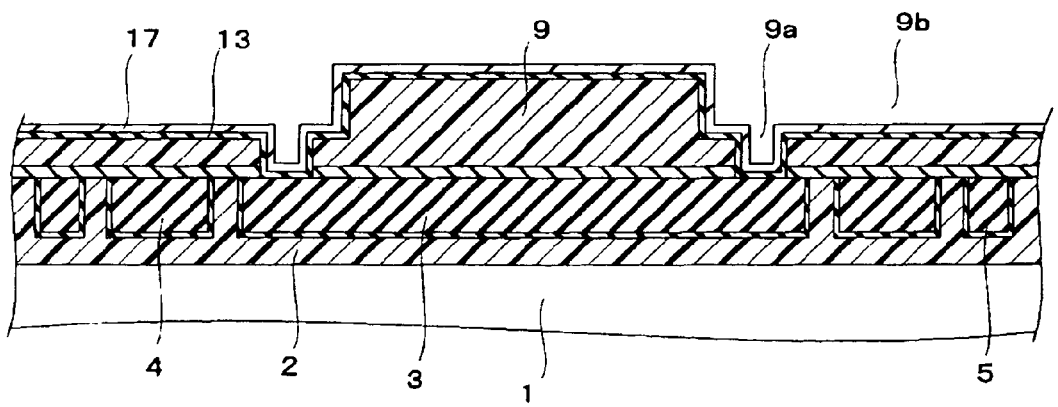

After the via holes 9a are formed, the barrier metal film 13 is formed on the interlayer insulating film 9 by, for example, a sputtering method or a CVD method as shown in FIG. 7B. After the barrier metal film 13 is formed, a seed film 17 for passing an electric current at the time of electrolytic plating is formed on the barrier metal film 13 by, for example, a sputtering method as shown in FIG. 7C.

Figure 8A:
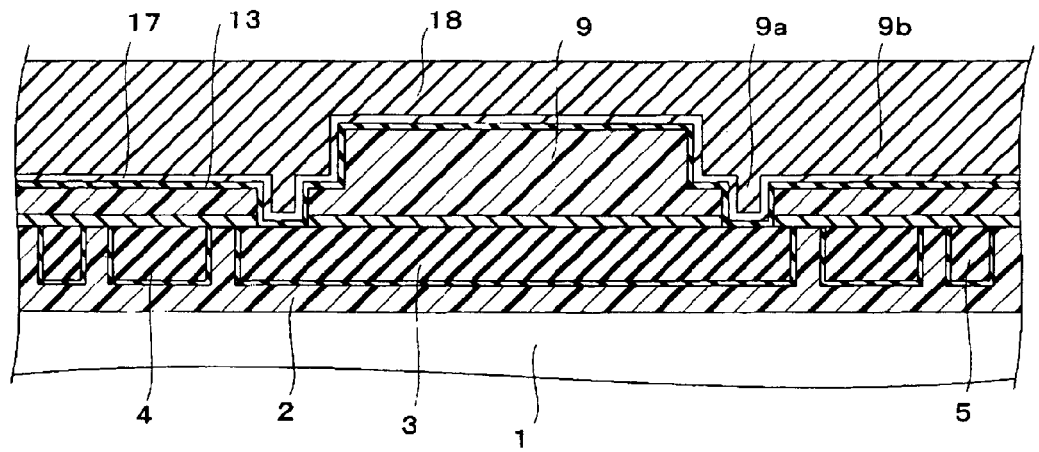
FIG. 8A through FIG. 8C are vertical sectional views schematically showing a manufacturing process of the semiconductor device according to the first embodiment.

After the seed film 17 is formed, a plated film 18 is formed on the seed film 17 by the electrolytic plating method as shown in FIG. 8A.

Figure 8B:
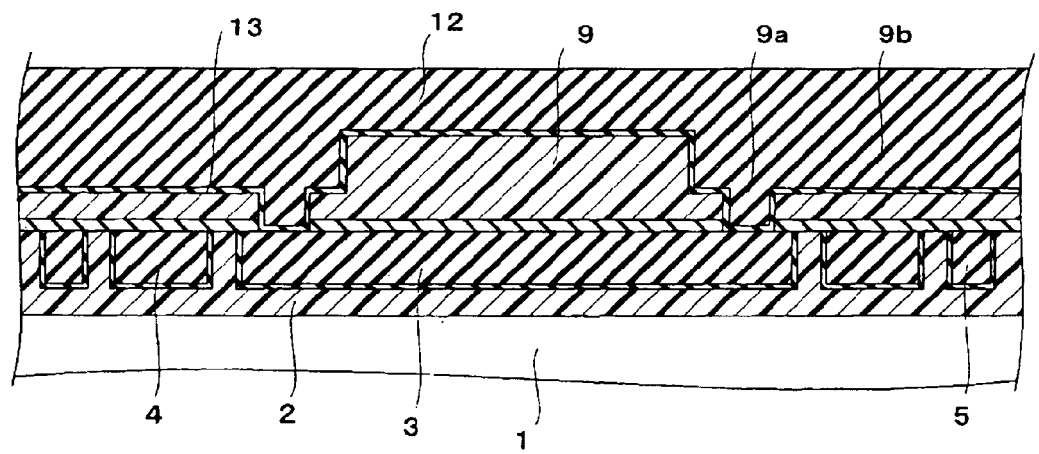

After the plated film 18 is formed, the semiconductor substrate 1 on which the plated film 18 is formed is subjected to a heat treatment (annealing) to grow crystal of the seed film 17 and the plated film 18, thereby forming the wiring film 12 as shown in FIG. 8B.

Figure 8C:
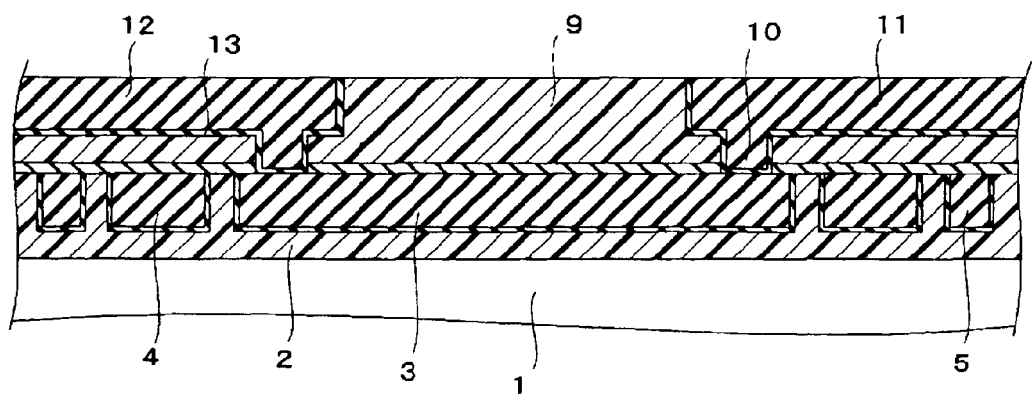

After the wiring film 12 is formed, unnecessary portions of the wiring film 12 and the barrier metal film 13 on the interlayer insulating film 9 are removed by polishing by, for example, chemical mechanical polishing, so that the wiring film 12 and the barrier metal film 13 which are in the via holes 9a and the wiring grooves 9b are remained as shown in FIG. 8C.

Thus, the via-plugs 10 which are connected to the first layer wiring 3 in the via-plug connecting region A are formed within the via holes 9a, and the second layer wiring 11 which is electrically connected to the first layer wiring 3 through the via-plugs 10 is formed within the wiring grooves 9b.

After the via-plugs 10 are formed, the cap insulating film 14 is formed on the interlayer insulating film 10 by, for example, a CVD method. Thus, the semiconductor device shown in FIG. 1 is formed.

It is described above that the resist pattern having the patterns of the first layer wiring 3 transferred is formed by photolithography, and the interlayer insulating film 2 is etched by RIE with this resist pattern used as a mask to form the wiring groove 2a on the interlayer insulating film 2.

This resist pattern can be formed according to the lithography data created by, for example, the following method. A photomask is formed according to the lithography data, and this photomask is used to expose a resist so to form a resist pattern. The first layer wiring 3 to be described below is virtual and not actually formed on the interlayer insulating film 2. Therefore, the "arrangement" and "deletion" below mean addition and deletion of data corresponding to wirings and the like to and from mask designing data (wiring data).

Figure 10:
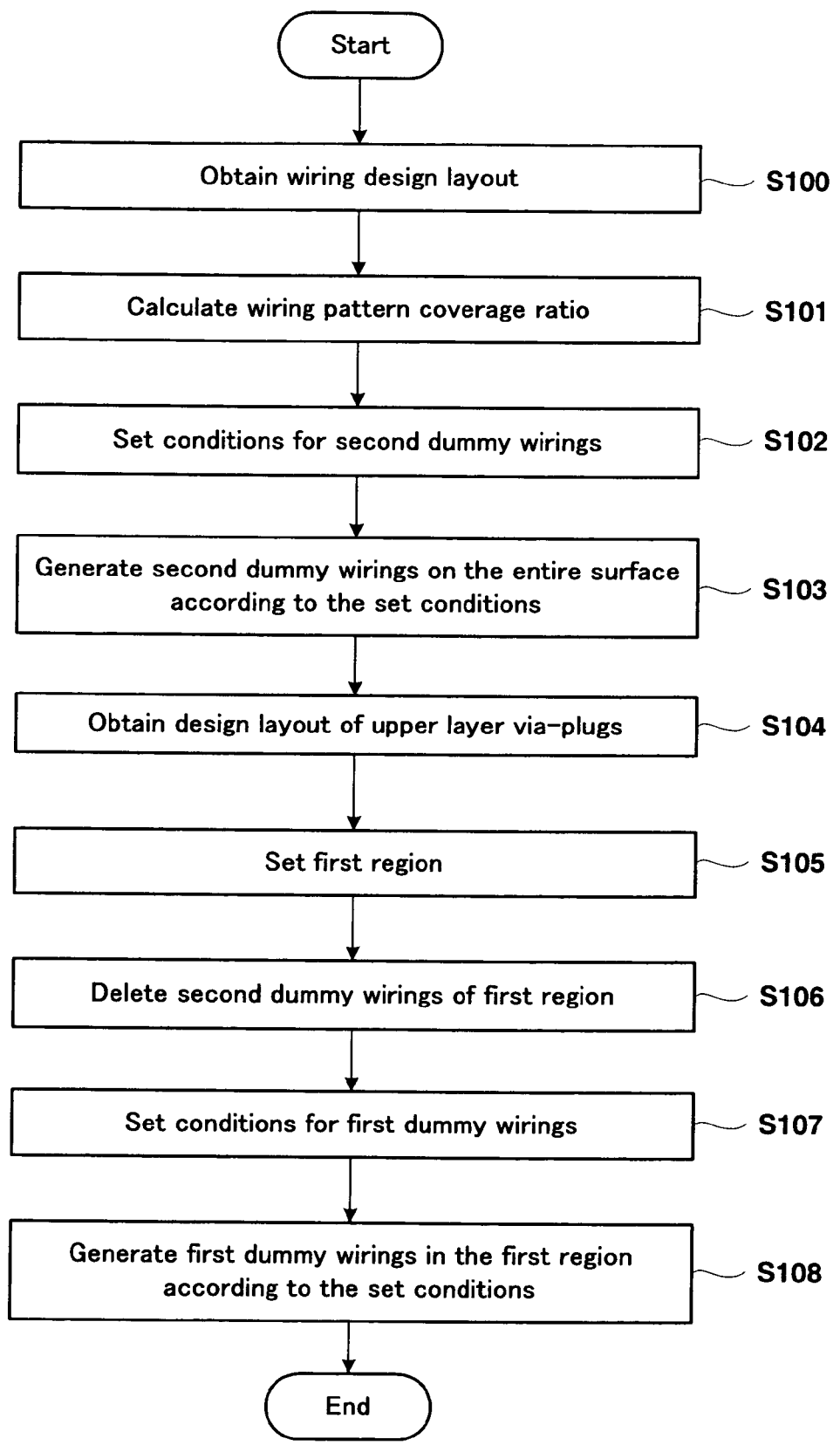
FIG. 10 is a flow chart showing a flow of a creating method of lithography data according to the first embodiment.

FIG. 10 is a flow chart showing a flow of a creating method of lithography data according to this embodiment, and FIG. 11A through FIG. 13B are diagrams schematically showing lithography data creating states according to this embodiment.

Figure 11A:
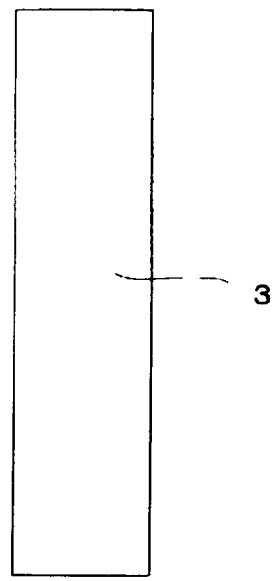
FIG. 11A and FIG. 11B are diagrams schematically showing a lithography data-creating state according to the first embodiment.

First, a design layout of the first layer wiring 3 is obtained from a database as shown in FIG. 10 and FIG. 11A (S100).

Then, a pattern coverage ratio of the first layer wiring 3 is calculated (S101).

Figure 11B:
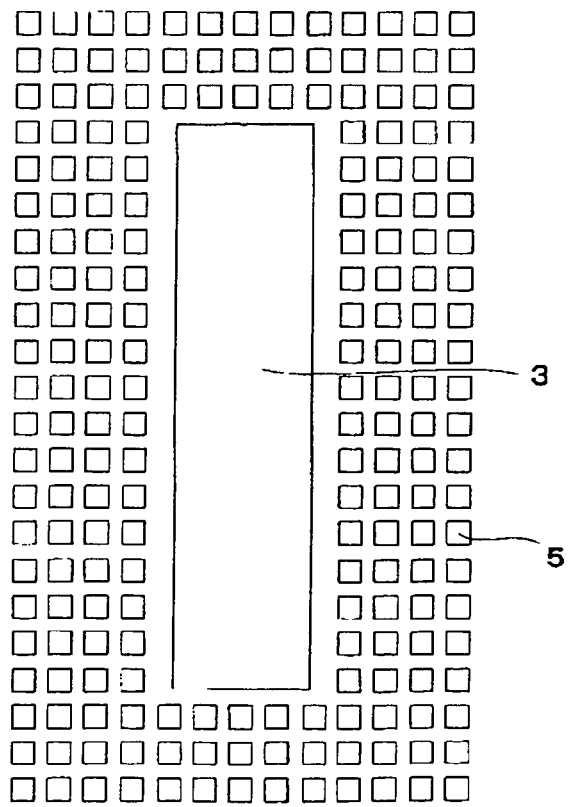

Then, conditions such as a width and a pattern coverage ratio for the second dummy wirings 5 are determined (S102), and according to the determined conditions, the second dummy wirings 5 are produced on the entire surface of a region excepting the first layer wiring 3 as shown in FIG. 11B on the layout of the first layer wiring 3 (S103). The second dummy wirings 5 are produced on the entire surface of a region excepting the first layer wiring 3, so that the second dummy wirings 5 are naturally also present in not only the second region C but also the first region B.

Figure 12A:
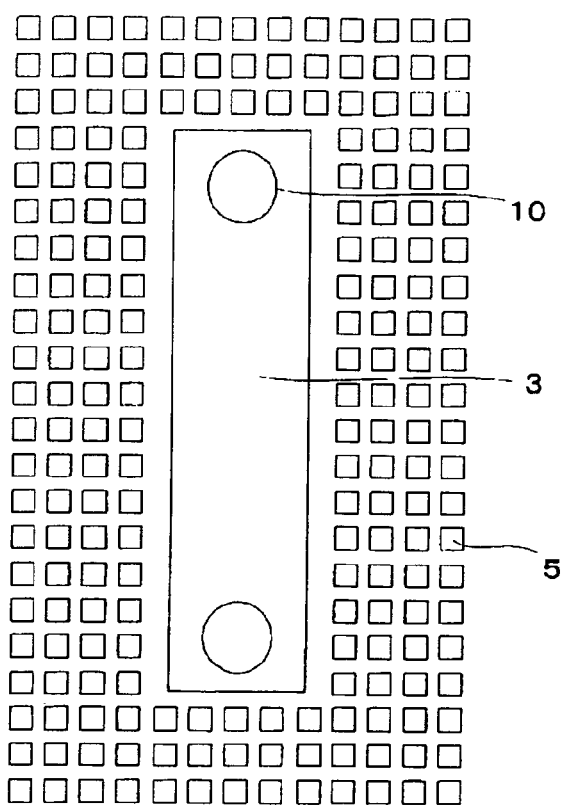
FIG. 12A and FIG. 12B are diagrams schematically showing a lithography data-creating state according to the first embodiment.

Subsequently, a design layout of the via-plugs 10 is obtained on the layout of the first layer wiring 3 and the second dummy wirings 5 from the database, as shown in FIG. 12A (S104).

Figure 12B:
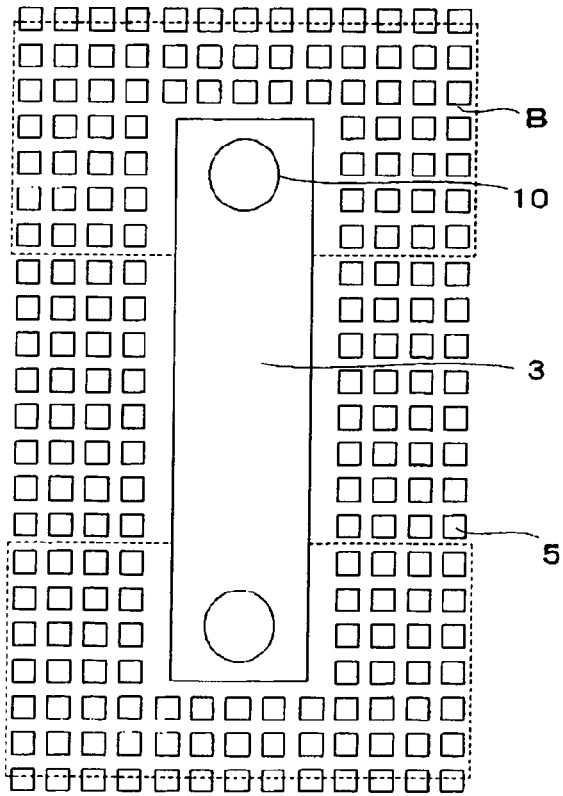
Figure 13A:
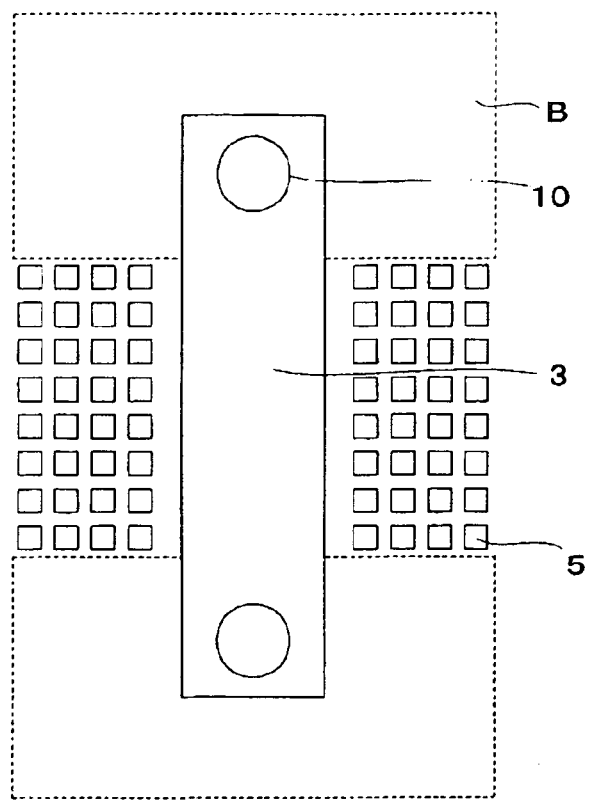
FIG. 13A and FIG. 13B are diagrams schematically showing a lithography data-creating state according to the first embodiment.

Then, the first region B is set as shown in FIG. 12B (S105), and the second dummy wirings 5 present in the first region B are removed as shown in FIG. 13A (S106).

Figure 13B:
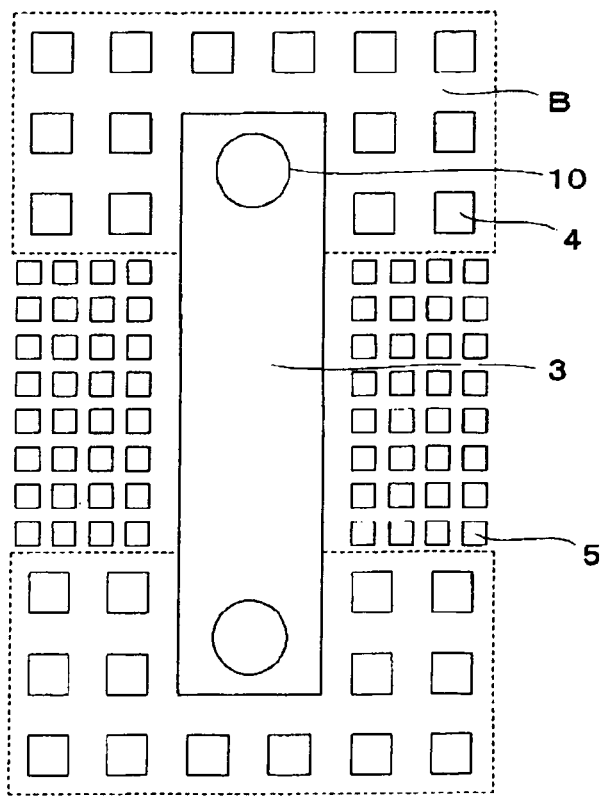

Lastly, conditions such as a width and a pattern coverage ratio for the first dummy wirings 4 are determined (S107), and according to the determined conditions, the first dummy wirings 4 are produced in the first region B as shown in FIG. 13B (S108).

Figure 14:
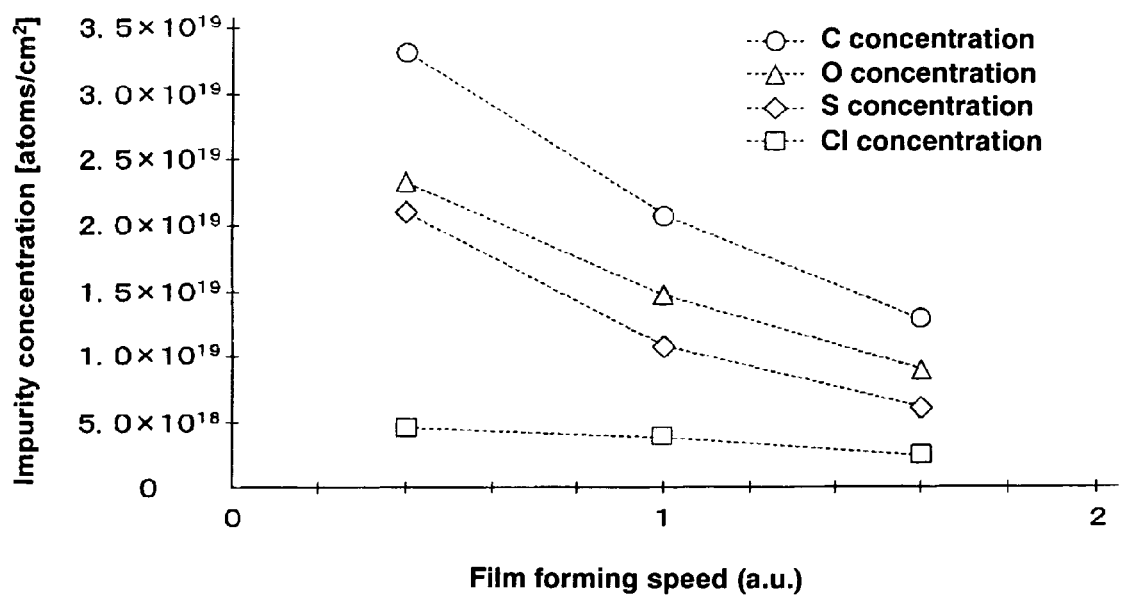
FIG. 14 is a graph showing a relationship between a plated film forming speed and an impurity concentration in the plated film according to the first embodiment.

A film forming speed of the plated film and an impurity concentration in the plated film are closely related. FIG. 14 is a graph showing a relationship between the film forming speed of the plated film and the impurity concentration in the plated film according to this embodiment. The impurity concentration in the plated film becomes high as the film forming speed of the plated film lowers as indicated by the graph of FIG. 14. Therefore, the impurity concentration in the plated film can be controlled partly by increasing the film forming speed of the plated film at a portion where the impurity concentration in the plated film is desired to be lowered and by decreasing the film forming speed of the plated film at a portion where the impurity concentration is desired to be increased.

Here, the film forming speed of the plated film can be decreased by forming the dummy wiring grooves near the wiring grooves. In other words, an additive that lowers the film forming activation energy and promotes the formation of the film adheres to not only the inside walls of the wiring grooves but also to the inside walls of the dummy wiring grooves at the time of plating, so that electric resistance in the dummy wiring grooves lowers, and an electric current is supplied in a large amount. Therefore, when the electric current supplied at the time of plating is constant, the electric current supplied into the wiring grooves is decreased when the dummy wiring grooves are formed near the wiring grooves. As a result, the film forming speed of the plated film in the wiring grooves lowers.

In a case where the dummy wiring grooves are formed near the wiring grooves, the film forming speed is variable depending on the sizes of the dummy wiring grooves. In other words, the additive adheres to the inside walls of the dummy wiring grooves as described above, so that the film forming speed of the plated film in the wiring grooves lowers as the inside walls of the dummy wiring grooves have a larger area. Here, the area of the inside walls of the dummy wiring grooves as a whole becomes large as the width of the dummy wiring grooves is decreased and the dummy wiring grooves are arranged densely. As a result, the film forming speed of the plated film in the wiring grooves can be decreased.

When the plated film 16 is formed with the first dummy wiring grooves 2b formed in the first region B, the plated film 16 is formed at a relatively high film forming speed at a portion, which becomes the via-plug connecting parts 3a, within the wiring groove 2a. Therefore, the plated film 16 having a low impurity concentration can be formed in this portion. Meanwhile, when the plated film 16 is formed in a state that the second dummy wiring grooves 2c having at least either a width smaller than that of the first dummy wiring grooves 2b or a pattern aperture ratio larger than that of the first dummy wiring grooves 2b is formed in the second region C, the plated film 16 is formed at a low film forming speed at a portion, which becomes the via-plug non-connecting part 3b in the wiring groove 2a, so that the plated film 16 having a high impurity concentration can be formed in the pertinent portion. Thus, this embodiment can provide an effect that both improvement of the initial electric property and improvement of reliability of the stress migration can be made.

In recent years, the interlayer insulating film is made porous or thin to decrease its specific inductive capacity. However, when the interlayer insulating film is made porous, the mechanical strength of the interlayer insulating film lowers. Meanwhile, this embodiment forms the first dummy wirings 4 having a width of exceeding 0.5 μm or a pattern coverage ratio of less than 25% in the first region B. Therefore, a metal coverage ratio on the surface of the interlayer insulating film 2 is increased, and the mechanical strength of the interlayer insulating film 2 can be prevented from lowering. But, it is desirable that the first dummy wirings 4 have a width of 100 μm or less in view of the attainment of flatness of the surface of the interlayer insulating film 2 after the formation of the first dummy wirings 4.

Besides, this embodiment also forms the second dummy wirings 5 in a region outside of the first region B and outside of the second region C. Therefore, a metal coverage ratio of the surface of the interlayer insulating film 2 can be increased further more, and the mechanical strength of the interlayer insulating film 2 can be further prevented from lowering.

It is not necessary to form the second dummy wirings 5 in a region outside of the first region B and outside of the second region C. And, dummy wirings having a width and a pattern coverage ratio different from those of the second dummy wirings 5 may be formed in a region outside of the first region B and outside of the second region C.

(Experiments)

Experiments will be described below. In the experiments, initial percent defective of wirings and percent defective of stress migration in a case where a plated film was formed in a state that dummy wiring grooves were formed near wiring grooves were examined. And, an appearance of wirings in a via-plug connecting region and a via-plug non-connecting part was observed.

In experiments 1 through 3, a sample having a structure that a first layer wiring having a width of 5 μm and a depth of 250 nm and a second layer wiring having a width of 0.18 μm and a depth of 300 nm were connected with via-plugs having a diameter of 0.1 μm was used.

The sample having the above structure was produced by substantially the same manufacturing method as in the above-described embodiment. Specifically, an oxide film was formed in thickness of 20 nm on an Si substrate (semiconductor substrate) having an active element, and an SiOC-based insulating film (interlayer insulating film) having a low dielectric constant was formed in thickness of 300 nm by a CVD method. Then, a wiring groove and dummy wiring grooves having a width of 5 μm and a depth of 250 nm were formed by a photolithography process and an RIE process. Subsequently, a Ta film (barrier metal film) was formed in thickness of 30 nm and a Cu film (seed film) was formed in thickness of 80 nm by a long throw sputtering method (LTS). Then, a Cu film (plated film) was formed in thickness of 800 nm by an electrolytic plating method and subjected to a heat treatment at 150° C. for 30 minutes. Besides, the plated film was polished by CMP to form a first layer wiring and dummy wirings having a width of 5 μm and a depth of 250 nm.

Besides, an SiC film (cap film) was formed in thickness of 50 nm by a plasma CVD method, and an SiOC film (interlayer insulating film) was formed in thickness of 800 nm. Then, via holes having a diameter of 0.1 μm and wiring grooves having a width of 0.18 μm and a depth of 300 nm were formed by a photolithography process and an RIE process. Subsequently, a Ta film (barrier metal film) was formed in thickness of 20 nm and a Cu film (seed film) was formed in thickness of 80 nm by a long throw sputtering method (LTS). Then, a Cu film (plated film) was formed in thickness of 800 nm by the electrolytic plating method and subjected to a heat treatment at 150° C. for 30 minutes. Besides, the plated film was polished by CMP to form via-plugs having a diameter of 0.1 μm and second layer wirings having a width of 0.18 μm and a depth of 300 nm.

Then, an SiC film (cap film) was formed in thickness of 70 μm by a plasma CVD method, and then a d-TEOS (a passivation film) was formed in thickness of 600 nm and a p-SiN (passivation film) was formed in thickness of 400 nm. Lastly, an Al pad process was performed to form electrode pads on the surface so not to expose Cu to the atmosphere.

Here, the sample used in the experiment 1 has 3 μm square dummy wirings formed at intervals of 1 μm in the first region and 0.1 μm square dummy wirings formed at intervals of 0.1 μm in the second region. The sample used in experiment 2 had 3 μm square dummy wirings formed at intervals of 1 μm in a first region and a second region. The sample used in experiment 3 had 0.1 μm square dummy wirings formed at intervals of 0.1 μm in a first region and a second region.

The samples of the experiments 1 through 3 were prepared in a plural number and measured for electric resistance values of wirings in order to check an initial defective. And, it was determined that the samples of which measured electric resistance value was a prescribed value or higher had an initial defective, and a percentage of the number of samples determined as having an initial defective with respect to the number of samples of every experiment was determined as an initial percent defective.

A stress migration accelerated test was performed in order to check a stress migration failure. The stress migration accelerated test was performed with the samples left standing at 230° C. for 800 hours. And, the samples, of which electric resistance value after the stress migration accelerated test was increased by 10% with respect to the electric resistance value before the stress migration accelerated test, were determined as having a stress migration failure. Here, the samples undergone the stress migration accelerated test did not include those which were determined as having an initial defective, and a percentage of the number of samples determined as having the stress migration failure with respect to the samples excluding those having an initial defective for every experiment was determined as a stress migration percent defective.

Besides, the first layer wirings at the via-plug connecting region and the via-plug non-connecting part before the stress migration accelerated test were examined for their cross sections by a dual beam device (FIB-SEM).

Experimental results will be described with reference to Table 1.

TABLE 1

|  | Experiment 1 | Experiment 2 | Experiment 3 |
|---|---|---|---|
| Initial percent defective | 0% | 0% | 4% |
| Percent defective of stress migration | 1% | 40% | 1% |
| Microvoids in via-plug connecting region | No | No | Yes |
| Microvoids in via-plug non-connecting part | Yes | Yes | Yes |

As shown in Table 1, the initial percent defective was 0% in the experiment 2, and no microvoid was found in the via-plug connecting region. In the experiment 2, the stress migration percent defective was 40%, and microvoids were found in the via-plug non-connecting part. It is presumed that such situations have occurred because the plated film at a portion which became the via-plug connecting part and a portion which became the via-plug non-connecting part had a high film forming speed, and impurities in the plated film at such portions were small in amount because the plated film was formed in the state that relatively large dummy wiring grooves were formed in the first region and the second region.

In the experiment 3, the initial percent defective was 4%, and microvoids were found in the via-plug connecting region. In the experiment 3, microvoids were found in the via-plug non-connecting part, but the stress migration percent defective was 1%. It is presumed that such situations have occurred because the plated film at a portion which became the via-plug connecting part and a part which became the via-plug non-connecting part had a low film forming speed, and impurities in the plated film at such portions were large in amount because the plated film was formed in the state that relatively small dummy wiring grooves were formed in the first region and the second region.

Meanwhile, in the experiment 1, the initial percent defective was 0%, and microvoids were not found in the via-plug connecting region. It is presumed that such situations have occurred because the plated film at a portion which became the via-plug connecting part had a high film forming speed, and impurities in the plated film at such a portion were small in amount because the plated film was formed in a state that relatively large dummy wiring grooves were formed in the first region.

And, in the experiment 1, microvoids were found in the via-plug non-connecting part, but the stress migration percent defective was 1%. It is presumed that such situations have occurred because the plated film at a portion which became the via-plug non-connecting part had a low film forming speed, and impurities in the plated film at such a portion were large in amount because the plated film was formed in a state that relatively small dummy wiring grooves were formed in the second region.

In a case where dummy wirings having a size and pattern coverage ratio as shown in FIG. 3A and FIG. 3B were formed in the first region and the second region, substantially the same results as those in the experiment 1 were obtained.

Second Embodiment

Figure 15:
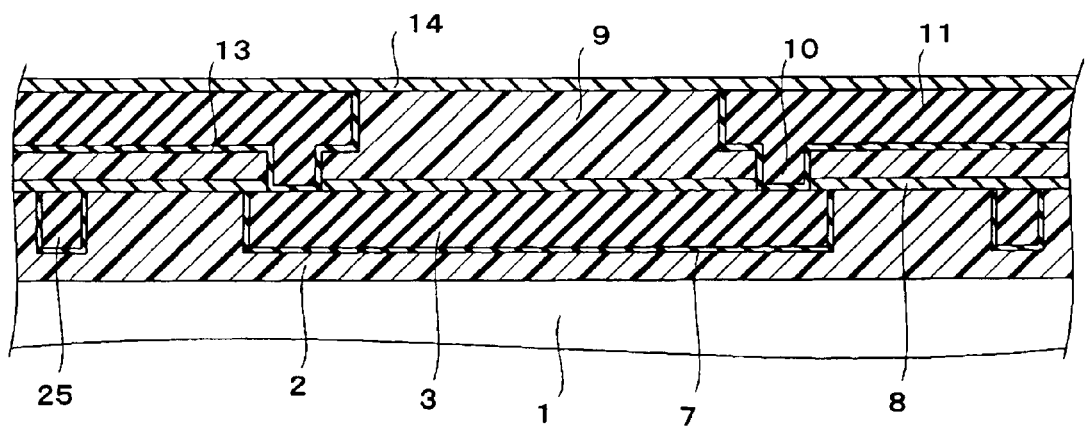
FIG. 15 is a schematic vertical sectional view of a semiconductor device according to a second embodiment.

A second embodiment will be described with reference to the drawings. An example that the dummy wirings are not arranged in the first region will be described in this embodiment. It should be noted that like members used in the same manner as those of the first embodiment are denoted by like reference numerals, and descriptions of the contents overlapping those described in the first embodiment will be omitted. FIG. 15 is a schematic vertical sectional view of a semiconductor device according to this embodiment, and FIG. 16 is a schematic horizontal sectional view of the semiconductor device according to this embodiment.

Figure 16:
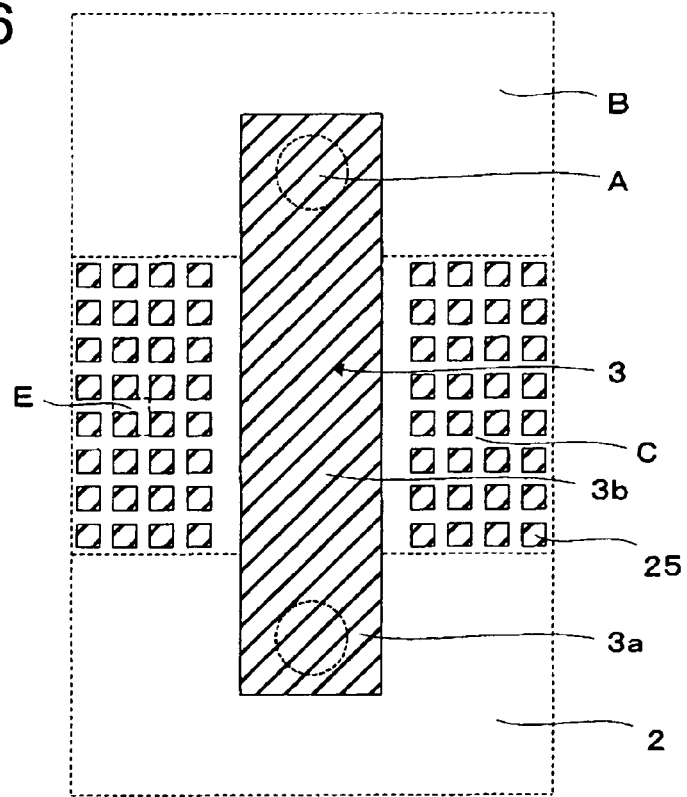
FIG. 16 is a schematic horizontal sectional view of the semiconductor device according to the second embodiment.

As shown in FIG. 15 and FIG. 16, a plurality of dummy wirings 25 having a width of 0.5 μm or less and a pattern coverage ratio of 25% or more are formed in the second region C in this embodiment. But, the dummy wirings 25 are not formed in the first region B. Either the dummy wirings 25 or other dummy wirings are not formed in the first region B. The width of the dummy wirings 25 and the pattern coverage ratio of the dummy wirings 25 are similar to the width of the second dummy wirings 5 and the pattern coverage ratio of the second dummy wirings 5 shown in FIG. 2. The pattern coverage ratio according to this embodiment is synonymous with the pattern coverage ratio according to the first embodiment.

Figure 17:
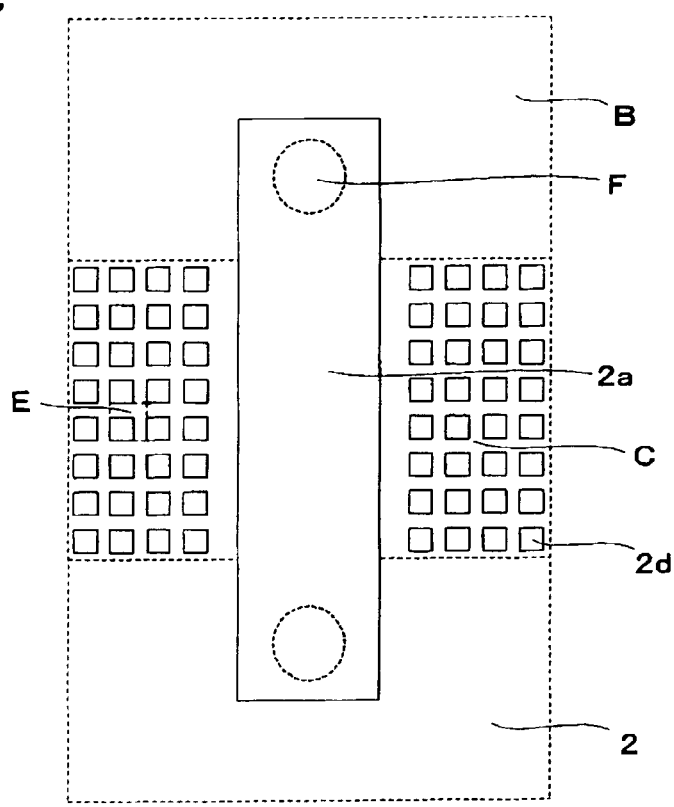
FIG. 17 is a plan view schematically showing a manufacturing process of the semiconductor device according to the second embodiment.

This semiconductor device can be manufactured by the following method. FIG. 17 is a plan view schematically showing a manufacturing process of the semiconductor device according to this embodiment. A process after the first layer wiring is formed is the same to that of the first embodiment, so that its description is omitted.

The interlayer insulating film 2 is formed on the semiconductor substrate 1 by, for example, a CVD method or the like, then the wiring groove 2a, dummy wiring grooves 2d and the like are formed on the interlayer insulating film 2 by photolithography or the like as shown in FIG. 17.

The wiring groove 2a is formed at positions including the scheduled via-plug connection region F. The dummy wiring grooves 2d are formed in the second region C. The width of the dummy wiring grooves 2d and the pattern aperture ratio of the dummy wiring grooves 2d are the same as the width of the second dummy wiring grooves 2c and the pattern aperture ratio of the second dummy wiring grooves 2c shown in FIG. 9. The pattern aperture ratio according to this embodiment is synonymous with the pattern aperture ratio according to the first embodiment.

After the wiring groove 2a is formed, the barrier metal film 7 is formed on the interlayer insulating film 2 by, for example, a sputtering method or the like, then the seed film 15 is formed on the barrier metal film 7 by, for example, a sputtering method.

After the seed film 15 is formed, the plated film 16 is formed on the seed film 15 by the electrolytic plating method, and the semiconductor substrate 1 is subjected to a heat treatment (annealing) to form the wiring film 6. Then, unnecessary portions of the wiring film 6 and the barrier metal film 7 on the interlayer insulating film 2 are removed by polishing by CMP. Thus, the first layer wiring 3 is formed in the wiring groove 2a, and the dummy wirings 25 are formed in the dummy wiring grooves 2d.

In this embodiment, the dummy wiring grooves such as the dummy wiring grooves 2d are not formed in the first region B, and the dummy wiring grooves 2d are formed in the second region C to form the plated film 16. Therefore, effects substantially the same as those in the first embodiment can be obtained. Here, in this embodiment, the dummy wirings are not formed in the first region B, so that the plated film 16 having an impurity concentration lower than that in the first embodiment can be formed at a portion, which becomes the via-plug connecting part, in the wiring groove 2a.

Other Embodiments

The present invention is not limited to the contents of the above-described embodiments, and the structures, materials, arrangements of the individual members and the like may be modified appropriately without deviating from the spirit and scope of the invention. For example, it was described in the above-described embodiments that the via-plugs 10 were connected to the first layer wiring 3, but the contact plugs may be used instead of the via-plugs 10. And, the first layer wiring 3 and the second layer wiring 11 were described in the above-described embodiments, but the embodiments are not limited to the first layer wiring 3 and the second layer wiring 11.

What is claimed is:

1. A semiconductor device, comprising:
   a semiconductor substrate;
   a first insulating film which is disposed above the semiconductor substrate;
   a second insulating film which is disposed above the first insulating film;
   a wiring which is disposed in the first insulating film and has a plug connecting part;
   a plug which is disposed in the second insulating film and connected to the plug connecting part;
   a plurality of first dummy wirings which are disposed in a first area near the plug connecting part in the first insulating film; and
   a plurality of second dummy wirings which are disposed in a second area near the wiring excepting the plug connecting part in the first insulating film, and have at least either a width smaller than that of the first dummy wirings or a pattern coverage ratio larger than that of the first dummy wirings.

2. The semiconductor device according to claim 1, wherein the wiring has a width of 0.3 μm or more.

3. The semiconductor device according to claim 1, wherein the first area is included in an area defined by a distance from a center of a region where the plug connecting part and the plug are connected, the distance being equal to an addition of at least 0.5 µm to a width of the wiring.

4. The semiconductor device according to claim 1, wherein the second dummy wirings have a width smaller than that of the first dummy wirings and a pattern coverage ratio larger than that of the first dummy wirings.

5. The semiconductor device according to claim 1, wherein the first dummy wirings have at least either a width larger than 0.5 µm or a pattern coverage ratio smaller than 25%.

6. The semiconductor device according to claim 1, further comprising:

a plurality of third dummy wirings which are disposed in a third area surrounding the first area and the second area in the first insulating film.

7. The semiconductor device according to claim 6, wherein the third dummy wirings have at least either a width smaller than that of the first dummy wirings or a pattern coverage ratio larger than that of the first dummy wirings.

* * * * *